(12) United States Patent
Rizzini et al.

(10) Patent No.: US 11,603,310 B2
(45) Date of Patent: Mar. 14, 2023

(54) MEMS DEVICE WITH OPTIMIZED GEOMETRY FOR REDUCING THE OFFSET DUE TO THE RADIOMETRIC EFFECT

(71) Applicant: STMICROELECTRONICS S.R.L., Agrate Brianza (IT)

(72) Inventors: Francesco Rizzini, Passirano (IT); Alessandro Tocchio, Milan (IT)

(73) Assignee: STMICROELECTRONICS S.R.L., Agrate Brianza (IT)

(*) Notice: Subject to any disclaimer, the term of this patent is extended or adjusted under 35 U.S.C. 154(b) by 87 days.

(21) Appl. No.: 16/736,485

(22) Filed: Jan. 7, 2020

(65) Prior Publication Data
US 2020/0216305 A1    Jul. 9, 2020

(30) Foreign Application Priority Data
Jan. 8, 2019    (IT) .................... 102019000000190

(51) Int. Cl.
*B81B 7/00*      (2006.01)
*G01P 15/02*     (2013.01)
(Continued)

(52) U.S. Cl.
CPC ........ *B81B 7/0019* (2013.01); *G01C 19/5712* (2013.01); *G01P 15/02* (2013.01);
(Continued)

(58) Field of Classification Search
CPC .... G01P 15/125; G01P 15/08; G01P 15/0802; G01P 15/18
See application file for complete search history.

(56) References Cited

U.S. PATENT DOCUMENTS

2006/0169043 A1*   8/2006   McNeil ................. G01P 15/125
                                                      73/514.01
2006/0185433 A1*   8/2006   Leonardson .......... G01P 15/125
                                                      73/514.32
(Continued)

FOREIGN PATENT DOCUMENTS

EP          2151691 A2      2/2010

OTHER PUBLICATIONS

Nagel et al., "Radiometric effects in MEMS accelerometers", 2017 IEEE Sensor, Oct. 1, 2017, pp. 1-3.
(Continued)

*Primary Examiner* — Helen C Kwok
(74) *Attorney, Agent, or Firm* — Seed Intellectual Property Law Group LLP

(57) ABSTRACT

A MEMS device with teeter-totter structure includes a mobile mass having an area in a plane and a thickness in a direction perpendicular to the plane. The mobile mass is tiltable about a rotation axis extending parallel to the plane and formed by a first and by a second half-masses arranged on opposite sides of the rotation axis. The first and the second masses have a first and a second centroid, respectively, arranged at a first and a second distance $b1$, $b2$, respectively, from the rotation axis. First through openings are formed in the first half-mass and, together with the first half-mass, have a first total perimeter $p1$ in the plane. Second through openings are formed in the second half-mass and, together with the second half-mass, have a second total perimeter $p2$ in the plane, where the first and the second perimeters $p1$, $p2$ satisfy the equation: $p1 \times b1 = p2 \times b2$.

16 Claims, 5 Drawing Sheets

(51) Int. Cl.
*G01P 15/08* (2006.01)
*G01P 15/125* (2006.01)
*G01C 19/5712* (2012.01)

(52) U.S. Cl.
CPC ............ *G01P 15/08* (2013.01); *G01P 15/125* (2013.01); *B81B 2201/0235* (2013.01); *B81B 2201/0242* (2013.01); *B81B 2203/0118* (2013.01); *B81B 2203/04* (2013.01); *B81B 2203/058* (2013.01); *B81B 2207/012* (2013.01)

(56) References Cited

U.S. PATENT DOCUMENTS

| | | | | |
|---|---|---|---|---|
| 2009/0031809 | A1* | 2/2009 | Lin | G01P 15/125 |
| | | | | 73/514.32 |
| 2010/0024553 | A1* | 2/2010 | Classen | G01P 15/0802 |
| | | | | 73/514.32 |
| 2010/0122578 | A1* | 5/2010 | Classen | G01P 15/125 |
| | | | | 73/514.32 |
| 2010/0175473 | A1* | 7/2010 | Classen | G01P 15/125 |
| | | | | 73/514.29 |
| 2011/0056297 | A1* | 3/2011 | Classen | G01P 15/125 |
| | | | | 73/514.32 |
| 2013/0042684 | A1* | 2/2013 | Yoda | G01P 15/125 |
| | | | | 73/514.01 |
| 2013/0263662 | A1* | 10/2013 | Tanaka | G01P 1/003 |
| | | | | 73/504.12 |
| 2015/0096378 | A1* | 4/2015 | Kigure | G01P 1/003 |
| | | | | 73/514.32 |
| 2018/0238926 | A1* | 8/2018 | Shiota | B81C 3/00 |
| 2018/0252745 | A1* | 9/2018 | Isobe | G01P 15/18 |
| 2019/0062149 | A1* | 2/2019 | Tanaka | B81B 3/0072 |
| 2019/0063924 | A1* | 2/2019 | Tanaka | G01P 15/125 |
| 2019/0383853 | A1* | 12/2019 | Reinmuth | G01P 15/125 |
| 2020/0156930 | A1* | 5/2020 | Classen | B81B 5/00 |
| 2021/0088548 | A1* | 3/2021 | Kiesel | G01P 15/18 |

OTHER PUBLICATIONS

Classen et al., "Advanced Surface Micromachining Process—A First Step Towards 3D MEMS", MEMS 2017, Las Vegas, NV, USA, Jan. 22-26, 2017, pp. 314-318.

* cited by examiner

MEMS DEVICE WITH OPTIMIZED GEOMETRY FOR REDUCING THE OFFSET DUE TO THE RADIOMETRIC EFFECT

BACKGROUND

Technical Field

The present disclosure relates to a MEMS device. In particular, the present disclosure relates to a MEMS (Micro-Electro-Mechanical System) inertial sensor, such as an accelerometer or a gyroscope

Description of the Related Art

As is known, the use of MEMS devices of the above type is progressively increasing in ever-wider technical fields, due to their capacity of supplying accurate signals, their low cost, and their high versatility.

In particular, inertial sensors of the above type are progressively used in consumer applications and in the automotive field, for example for indoor navigation and as aids to autonomous driving, i.e., applications where it is important to have a high precision and provide outputs as stable as possible also when the environmental and/or internal parameters vary. In particular, in these applications, it is desirable for the output signals of the device to be stable in temperature, both with respect to external effects, which operate in a uniform way over the entire die integrating the device, and with respect to internal effects, operating in different ways within the die. To take into account the external effects, many MEMS devices have arrangements for compensating signal variations due to the external temperature. As regards the internal effects, the problem has only recently been recognised and tackled, as discussed hereinafter.

In general, non-uniform temperature distributions within a MEMS device of the above type have various grounds. A first ground is linked to the high integration density of electronic devices in complex apparatuses; other grounds may be linked to contingent situations.

For instance, FIG. 1 shows an exemplar situation in which a printed-circuit board 1 carries two MEMS devices 2 of an inertial type, arranged one above and one beneath the printed-circuit board 1, and a processing device (CPU) 3 or application specific integrated circuit (ASIC). In some applications, the printed-circuit board 1 may carry just one MEMS device or a plurality of MEMS devices or other integrated devices, arranged alongside each other also in planes extending before or behind of the sheet plane, on just one side or on both sides of the printed-circuit board 1, in a not shown manner. In this situation, the small distance and the high number of energy dissipating devices at a short distance on one side of the considered MEMS device or on the opposite surface of the printed-circuit board 1 may give rise to temperature profiles variable in a horizontal or vertical direction (with reference to the sheet plane).

Other causes of non-uniform temperature distributions are linked to operating considerations. In fact, In some situations, for example at turning-on of the device, fast temperature variations may lead to a non-uniform distribution within the die, as represented in FIG. 2. Here a sensor 5 comprises a MEMS device 6, carried by a printed-circuit board 7 and, in turn, carrying an integrated device 8, such as an ASIC (Application-Specific Integrated Circuit). In this case, at least in some operating conditions, there is a non-constant temperature profile in a vertical direction as a result of the integrated device 7, which, during its operation, emits heat.

In this situation, the MEMS device 6 may have a variable temperature profile, and precisely decreasing from a high value on the top face of the MEMS device 6 to a lower value on the bottom face of the MEMS device 6.

It has been demonstrated that a temperature gradient along axis Z (out-of-plane direction) in a sensor mobile in this direction causes a static deviation of the offset of the output signal representing the movement along axis Z, whereas the output signals representing movements along the other axes X and Y are not affected by this phenomenon. This situation is represented in FIGS. 3 and 4, which are schematic illustrations of an inertial sensor having "teeter-totter" structure.

In detail, FIGS. 3 and 4 show a MEMS accelerometer 10 formed by a mobile mass 11 having a top surface 11A and a bottom surface 11B and suspended over a substrate 12. The mobile mass 11 is roughly formed by a platform or plate having a main extension in a plane that, at rest, is parallel to plane XY of a Cartesian reference system XYZ. The mobile mass 11 may, for example, have (in top plan view) a generally rectangular shape and is carried by a pillar 13 extending from the substrate 12 parallel to axis Z of the Cartesian reference system XYZ. The pillar 13 is coupled to the mobile mass 11 via hinges and springs (not shown) allowing rotation of the mobile mass 11 about a rotation axis O parallel to axis Y extending through the mobile mass 11.

In particular, in these devices, the rotation axis O is eccentric and is spaced from the centroid (not shown) of the mobile mass 11 and divides the mobile mass 11 into a first half-mass 14A and a second half-mass 14B, arranged on opposite sides with respect to the rotation axis O. The first and the second half-masses 14A, 14B have different sizes, and thus the corresponding centroids (not shown) are at different distances from the rotation axis O. In the example shown, the first half-mass 14A has a size smaller than the second half-mass 14B.

A first and a second electrode 16A, 16B are arranged underneath the first and the second half-masses 14A, 14B (facing the bottom surface 11B of the mobile mass 11). In detail, the first and a second electrode 16A, 16B face the first and the second half-masses 14A, 14B, respectively, and form therewith a first and a second capacitive element 17A, 17B, respectively, having capacitances C1 and C2, respectively.

FIG. 3 shows the ideal situation in absence of (internal or external) forces acting on the mobile mass 11. In this situation, the mobile mass 11 is in a resting position, and its main extension plane is parallel to plane XY, as mentioned above. In this situation, the first and the second half-masses 14A, 14B are arranged at the same distances from the respective electrode 16A, 16B, and the capacitive elements 17A, 17B have capacitances $C1_0=C2_0$. A processing circuit (not shown), connected to the capacitive elements 17A, 17B is able to convert the difference between the capacitances C1 and C2 into a voltage output signal. With no acceleration, the output of this circuit is zero.

In FIG. 4, a hot source 21 has been arranged above the mobile mass 11 facing the top surface 11A, and a cold source 22 has been arranged underneath the mobile mass 11 facing the bottom surface 11B.

The sources 21 and 22 generate a temperature gradient within the mobile mass 11 in a direction parallel to axis Z. In this situation, even with no applied external forces, the mobile mass 11 turns, here in a clockwise direction (arrow 25). Consequently, the capacitive elements 17A, 17B have a different capacitance (namely, C2>C1) and the output signal becomes nonzero.

Rotation of the mobile mass 11 with an internal temperature gradient is caused by radiometric effects. These effects, discovered in 1873 by William Crookes and exploited in the Crookes radiometer (also known as "light mill") are linked to the action exerted by gas molecules acting in a differential way on opposite surfaces, heated at different temperatures. In particular, according to Einstein's radiometric theory, the radiometric forces depend upon the mean free path λ of the molecules of the gas in which the considered body (MEMS device 10) is immersed; the mean free path, in turn, depends upon the gas density and the molecule section. The radiometric forces moreover depend upon the value and direction of the temperature gradient and, for a plate-shaped structure having a cavity, follow the law:

$$F_{2p} = -\frac{1}{2} P_c \frac{\lambda^2}{T_0} \frac{\partial T}{\partial x} L = -\frac{1}{2} \frac{\lambda_0^2}{T_0} \frac{P_0^2}{P_c} \frac{\partial T}{\partial x} L = -\frac{1}{2} P_c \frac{\lambda_0^2}{T_0} \left(\frac{P_0}{P_c}\right)^2 \frac{\partial T}{\partial x} L \quad (1)$$

where:
$F_{2p}$ is the force acting on the structure;
$P_0$ is the standard pressure (1 bar);
$P_c$ is the pressure in the cavity;
λ is the mean free path of the gas molecules at pressure $P_c$
$\lambda_0$ is the mean free path of the gas molecules at pressure $P_0$
$T_0$ is the standard temperature (25° C.);
L is the perimeter of the cavity; and $$\frac{\partial T}{\partial x}$$

is the temperature profile through the structure.
Assuming that the temperature variation depends only upon space and due to the small thickness of the plate-shaped structure, we have:

$$\frac{\partial T}{\partial x} = \frac{dT}{dx} = \frac{T_h - T_c}{t_p}$$

where $T_h$ is the temperature of the hot face of the structure, $T_c$ is the temperature of the cold face of the structure, and $t_p$ is the thickness of the structure.
Eq. (1) thus becomes:

$$F_{2p} = -\frac{1}{2} P_c \frac{\lambda_0^2}{T_0} \left(\frac{P_0}{P_c}\right)^2 \frac{T_h - T_c}{t_p} L \quad (2)$$

The problem of the radiometric forces acting on a mobile mass (having a flat shape) of a MEMS device has so far not been tackled very much. A solution is described in the papers "ADVANCED SURFACE MICROMACHINING PROCESS—A FIRST STEP TOWARDS 3D MEMS" by J. Classen et al., MEMS 2017, Las Vegas, Nev., USA, Jan. 22-26, 2017, IEEE, 978-1-5090-5078-9/17 and "Radiometric effects in MEMS Accelerometers", by C. Nagel et al., IEEE, 978-1-5090-1012-7/17, which describe an accelerometer configured to detect forces acting in direction Z (out of the plane of the mobile platform) having a symmetrical structure, shown in FIGS. 5 to 7.

In detail, the accelerometer described in the above papers (designated by 30 in FIGS. 5 to 7) has a rectangular shaped mobile mass 31 hinged to a pillar 33 in a median position, as may be seen in particular in the top plan view of FIG. 6, where the rotation axis is designated by O1 and extends parallel to the shorter sides of the rectangle, equidistant from them. The mobile mass 31 is formed by a platform of semiconductor material, comprising two half-masses 32A, 32B having a plurality of through holes 34. As may be seen, in particular, in FIG. 6, the through holes 34 have the same area in a plane parallel to plane XY of a Cartesian reference system XYZ and present an arrangement symmetrical with respect to the rotation axis O1.

As may be noted, in particular, in the cross-section of FIG. 7, each half-mass 32A, 32B comprises a first portion 35A, respectively 35B, contiguous to the rotation axis O1 and a second portion 36A, 36B arranged more remotely from the rotation axis O1, as a prolongation of the respective first portion 35A, 35B.

The first portions 35A, 35B are identical to each other and in particular have the same area in a plane parallel to the plane XY (as may be noted in FIG. 6) and the same thickness along axis Z (as may be noted in FIG. 7, showing a cross-section view parallel to plane XY of the Cartesian reference system XYZ). The second portions 36A, 36B have the same area but a different thickness along axis Z: the second portion 36A of the first half-mass 32A (on the left in FIGS. 5 to 7) has a smaller thickness than the second portion 36B of the second half-mass 32B (on the right in FIGS. 5 to 7). In particular, in the example shown, the second portion 36A of the first half-mass 32A has the same thickness as the first portions 35A, 35B, and the second portion 36B of the second half-mass 32B has a larger thickness.

A substrate 44, top electrodes 40A, 40B (carried by the mobile mass 31), and bottom electrodes 41A, 42B (carried by the substrate 44), together with a cap 43 complete the structure of the accelerometer 30.

FIG. 7 shows the forces acting on the half-masses 32A and 32B in presence of a temperature gradient within the mobile mass 31, with hot air molecules moving from below upwards (as represented by the arrows 46, in darker grey in the hotter areas, at the top, and lighter grey in the colder areas, at the bottom).

In this situation, on the hypothesis that the thicknesses of the portions 35A, 35B, 36A (and thus 36B) of the two half-masses 32A, 32B are larger than the mean free path λ of the gas molecules, a first and a second radiometric force F1, F2 (FIG. 7) act on the first and the second half-masses 32A, 32B and are different from each other, because of the different thicknesses of the two half-masses 32A, 32B. Since the two half-masses 32A, 32B have their centroids arranged at the same distance from the rotation axis O1 and thus the same application arm of the forces F1, F2, it is possible to demonstrate that the ratio between the moments acting on the half-masses 32A, 32B is inversely proportional to the ratio of the respective thicknesses and thus different from 1.

Consequently, different moments act on the two half-masses 32A, 32B and cause a rotation of the mobile mass 31, in the considered example (with the temperature of the top surface of the mobile mass 31 higher than on the bottom surface) in a clockwise direction.

It follows that, also with this known structure, the radiometric effect creates a non-negligible twisting moment that leads to offset deviations in the output signal of the accelerometer.

BRIEF SUMMARY

One or more embodiments of the present disclosure relates to a MEMS device with optimised geometry for reducing offset due to the radiometric effect. In one embodiment, the present disclosure relates to a MEMS (Micro-Electro-Mechanical System) inertial sensor, such as an accelerometer or a gyroscope, having so-called "teeter-totter" structure, wherein a suspended mass is tiltable about a horizontal rotation axis belonging to the plane of extension of the suspended mass and extending therethrough so that the two parts of the suspended mass arranged on opposite sides of the rotation axis move in opposite directions, transversal to the plane of extension (the so-called out-of-plane movement or Z movement).

BRIEF DESCRIPTION OF THE SEVERAL VIEWS OF THE DRAWINGS

For a better understanding of the present disclosure, embodiments thereof are now described, purely by way of non-limiting example, with reference to the attached drawings, wherein.

DETAILED DESCRIPTION

Figure 1:
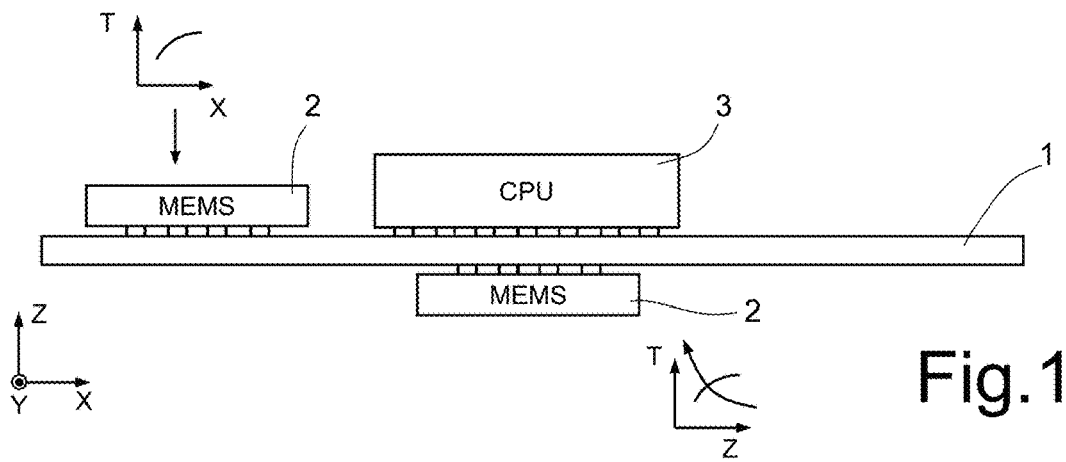
FIG. 1 is a schematic illustration of a system comprising a plurality of MEMS sensors and the corresponding electronic unit on a printed-circuit board.
Figure 2:
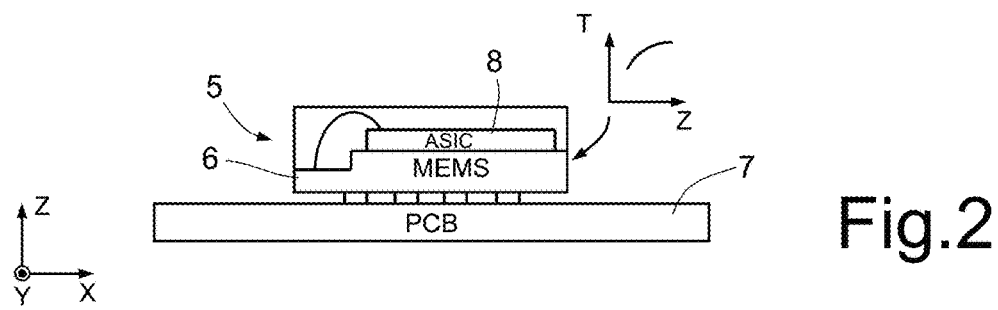
FIG. 2 is a schematic illustration of another MEMS sensor with different arrangement of the sensor and of the electronic unit.
Figure 3:
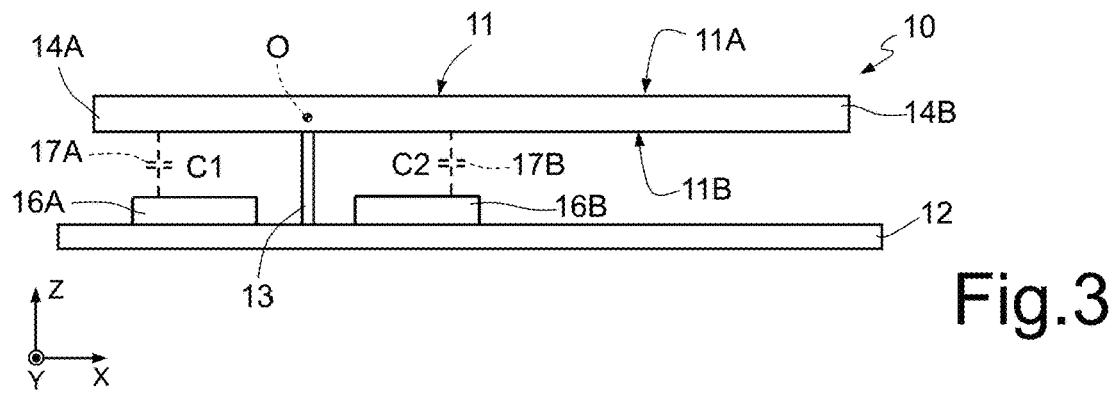
FIG. 3 is a schematic side view of a MEMS sensor of a "teeter-totter" type in a resting condition and in absence of stresses.
Figure 4:
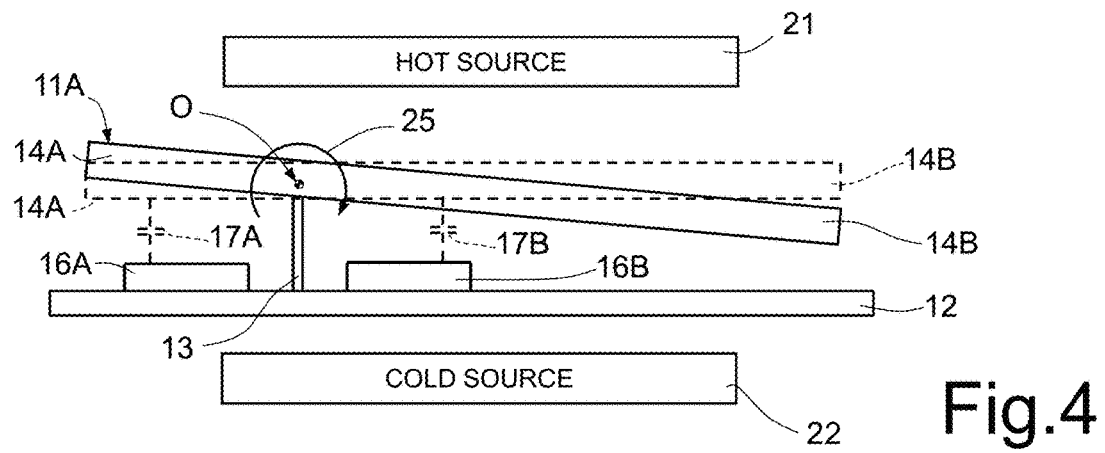
FIG. 4 is a schematic side view of a MEMS sensor of a "teeter-totter" type in presence of stresses due to the radiometric effect.
Figure 5:
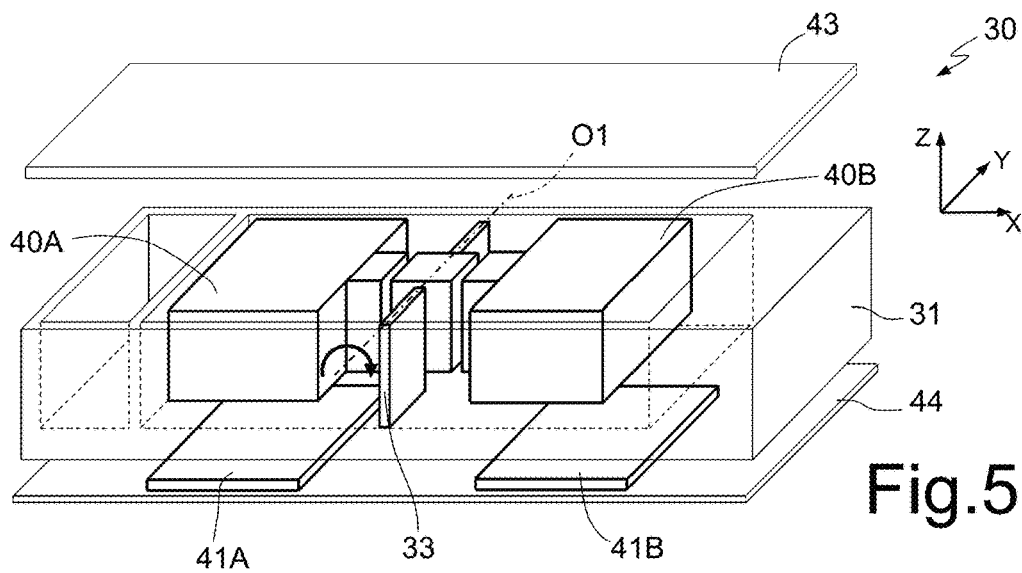
FIG. 5 is a simplified perspective view of a known accelerometer.
Figure 6:
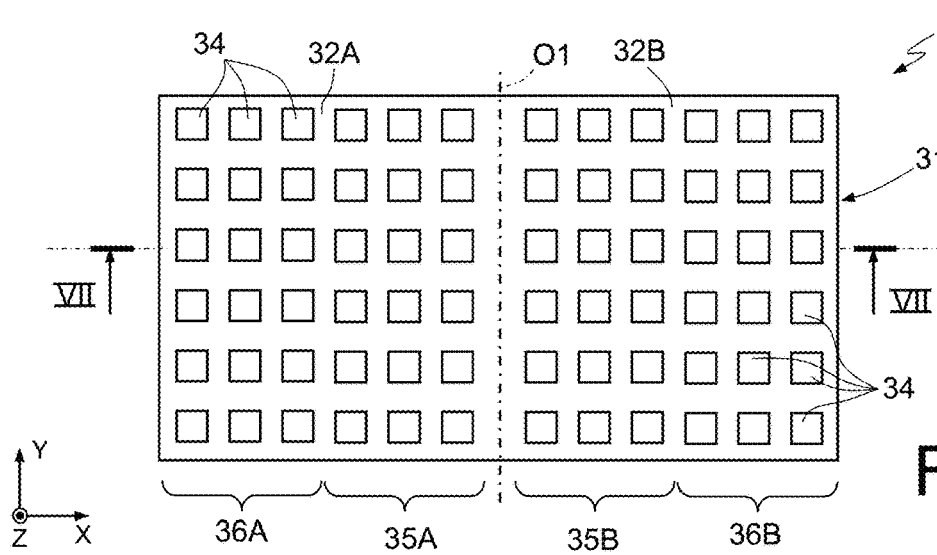
FIG. 6 is a top plan view of the accelerometer of FIG. 5.
Figure 7:
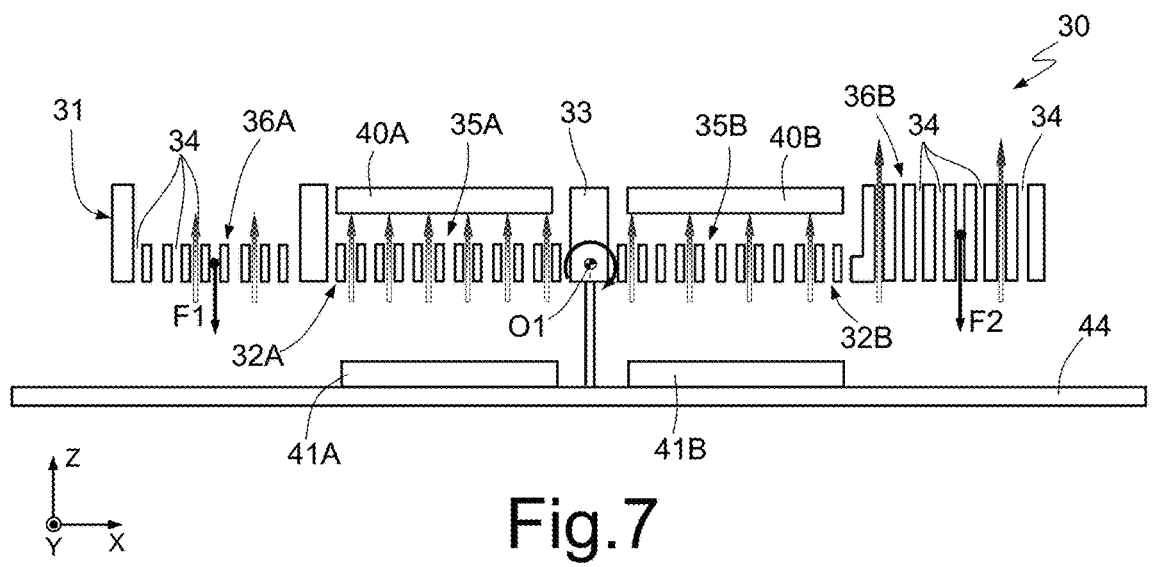
FIG. 7 is a schematic longitudinal section, taken along the section plane VII-VII of FIG. 6, representing the acting forces caused by the radiometric effect.
Figure 8:
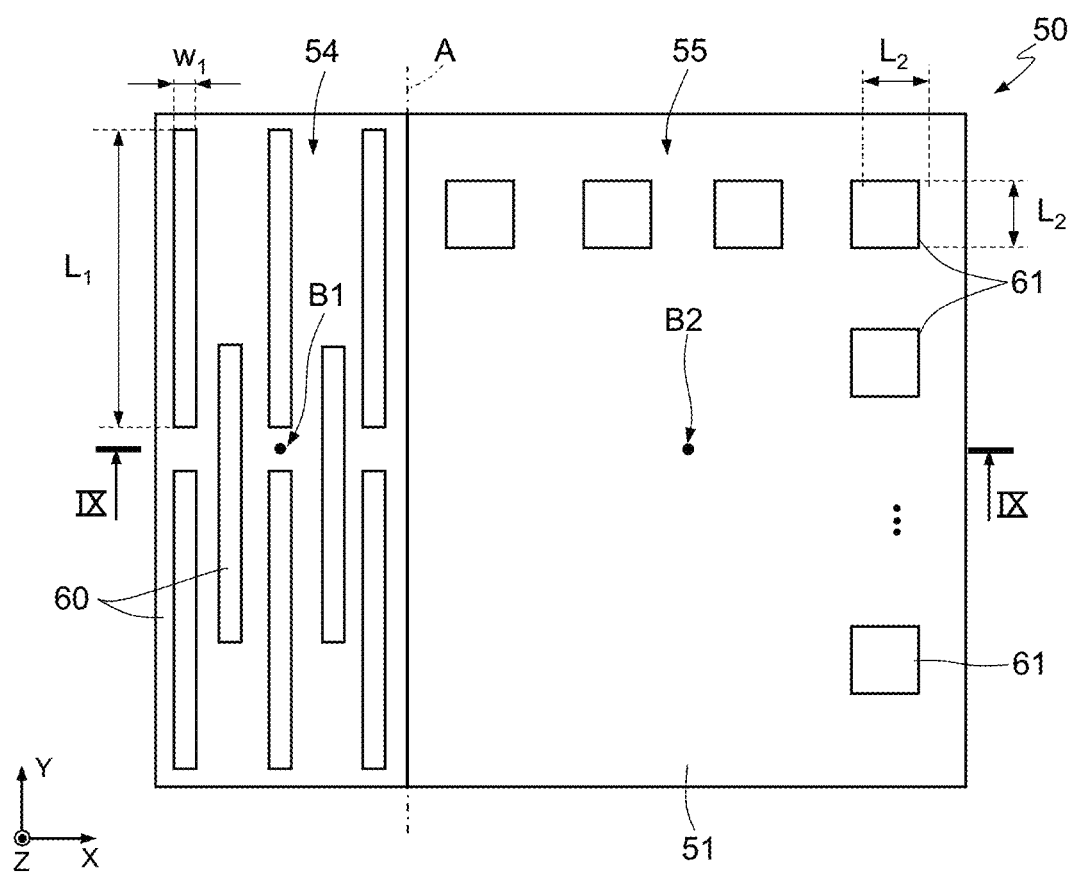
FIG. 8 is a schematic top plan view of the layout of the mobile mass according to an embodiment of the present device.
Figure 9:
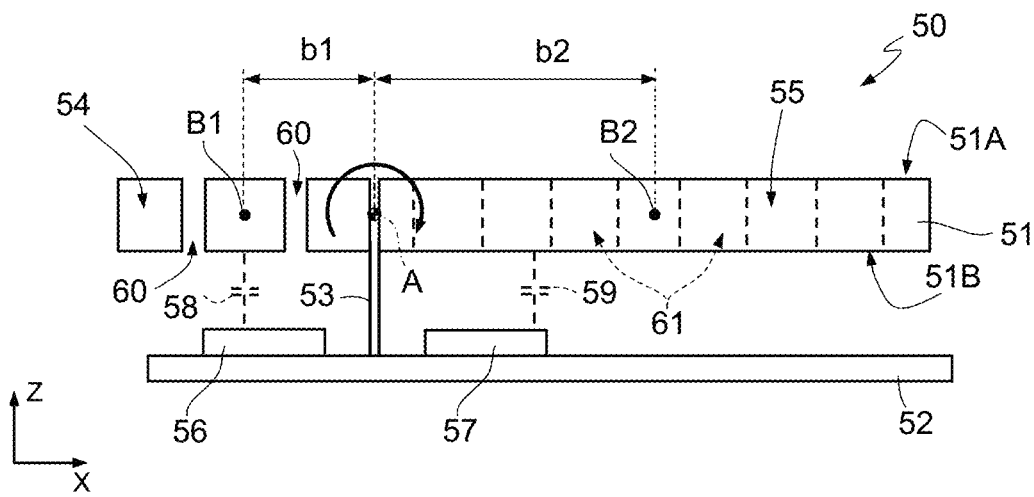
FIG. 9 is a schematic longitudinal section, taken along the section plane IX-IX of FIG. 8 of the present device.

FIGS. 8 and 9 are schematic illustrations of a sensor 50 of an inertial type having a so-called "teeter-totter" structure.

In detail, the sensor 50 comprises a mobile mass 51 suspended over a substrate 52 (FIG. 9) through a pillar 53, which extends from the substrate 52 parallel to axis Z of a Cartesian reference system XYZ. The pillar 53 is coupled to the mobile mass 51 through hinges and springs (not shown), which enable tilting of the mobile mass 51 about a rotation axis A.

The mobile mass 51 has a characteristic quantity (here the length in direction X) much greater than its thickness, for example ten times greater. In particular, at rest, the mobile mass 51 has main surfaces (top surface 51A and bottom surface 51B) extending in a plane parallel to plane XY of the Cartesian reference system XYZ and a thickness $t_p$ extending parallel to axis Z. The thickness $t_p$ of the mobile mass 51 is uniform over its entire area, as may be seen in FIG. 9. In the shown example, the mobile mass 51 has (in top plan view) a generally rectangular shape with sides parallel to axes X and Y, and the rotation axis A (which extends parallel to axis Y) is eccentric with respect to the rectangular shape of the mobile mass 51. Consequently, the rotation axis A divides the mobile mass 51 into a first half-mass 54 and a second half-mass 55, which are arranged on opposite sides with respect to the rotation axis A and have different areas. The first and the second half-masses 54, 55 thus each have an own centroid B1, B2 arranged at a first distance b1 and a second distance b2, respectively, different from each other, from the rotation axis A, as shown in FIG. 9. In particular, in the device 50 shown in FIGS. 8 and 9, b1<b2.

A first and a second electrode 56, 57 are arranged in front of the bottom surface 51B, facing the first and the second half-mass 54, 55, respectively, and form therewith a first and a second capacitive element 58, 59, respectively.

The half-masses 54, 55 are perforated in a non-uniform way; in particular, the first half-mass 54 has first holes 60, and the second half-mass 61 has second holes 61.

The first holes 60 and the second holes 61 are provided in a number and have dimensions such as to globally define (together with the corresponding half-masses 54, 55) a first perimeter p1 and a second perimeter p2 different from each other, with p1>p2, and such as to satisfy the following equation:

$$p1 \times b1 = p2 \times b2 \tag{3}$$

In particular, in Eq. (3) above, the first perimeter p1 is given by the sum of all the perimeters of the first holes 60 and of the outer perimeter of the half-mass 54, and, likewise, the second perimeter p2 is given by the sum of all the perimeters of the second holes 61 and of the outer perimeter of the half-mass 55.

In FIG. 8, this is represented by forming first holes 60 that are different in number from the second holes 61 and have a rectangular shape, with length W1 of the shorter side and length L1 of the longer side, whereas the second holes 61 have a square shape, with side L2>L1. However, the combinations of number, shape, and arrangement of the holes 61, 62 is infinite, and the only condition to be satisfied, to minimise the drift due to the radiometric effect, is Eq. (3).

For instance, the second holes 61 may also have a rectangular shape with length W2 of the shorter side and length L2 of the longer side. Consequently, in general, and on the hypothesis of having first and second holes 60, 61 all with rectangular shape, Eq. (3) becomes $$N1 \, (W1 \, L1) b1 = N2 \, (W2 \, L2) b2 \tag{3.1}$$

wherein N1 is the number of first holes 60, and N2 is the number of second holes 61.

In this situation, Eq. (2) becomes (the quantities being indexed by 1 or 2 according to whether they refer to the first or the second mass 54, 55 or being without index, if they are the same for both masses)

$$F_1 = -\frac{1}{2} P_c \frac{\lambda_0^2}{T_0} \left(\frac{P_0}{P_c}\right)^2 \frac{T_h - T_c}{t_p} p1 \tag{2.1}$$

$$F_2 = -\frac{1}{2} P_c \frac{\lambda_0^2}{T_0} \left(\frac{P_0}{P_c}\right)^2 \frac{T_h - T_c}{t_p} p2 \tag{2.2}$$

Moreover, the moments M1 and M2 acting on the first and the second masses 54, 55 are given, respectively, by $$M1 = F1\,b1 \quad (4.1)$$

$$M2 = F2\,b2 \quad (4.2)$$

Combining Eqs. (2.1), (2.2), (4.1) and (4.2) and taking into account Eq. (3), we obtain $$\frac{M1}{M2} = \frac{F1b1}{F2b2} = \frac{p1b1}{p2b2} = 1 \quad (5)$$

Thus, moments M1, M2 of equal value act on the first and on the second mass 54, 55, respectively, and compensate each other. It follows that, with the indicated geometrical conditions, the radiometric forces act on the mobile mass 51, but do not cause rotation of the mobile mass 51 and thus do not give rise to an offset signal.

Figure 10:
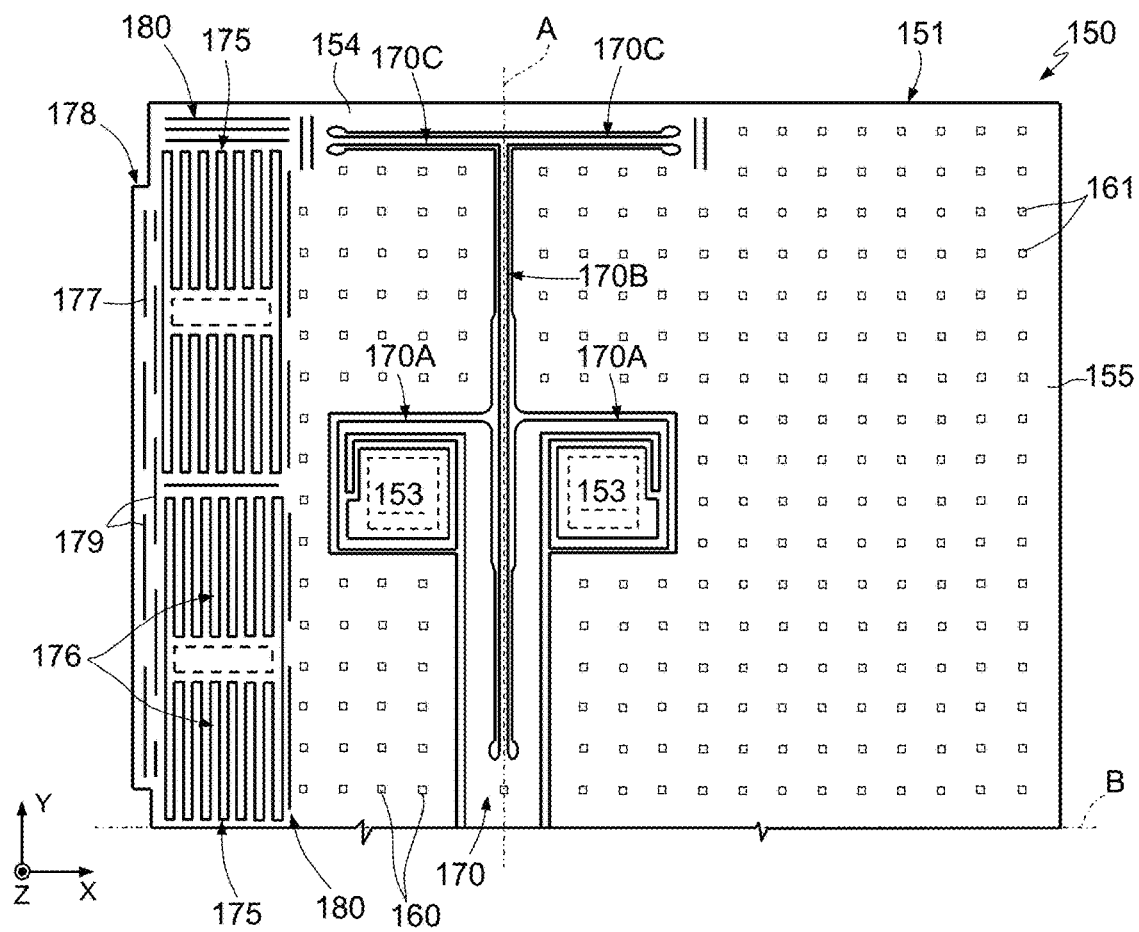
FIG. 10 is a top plan view of a possible embodiment of the present device.

An embodiment of an accelerometer that satisfies above condition (3) or (3.1) and thus has a compensated radiometric effect is shown in FIG. 10, where, for simplicity, parts equivalent to those of the sensor 50 of FIGS. 8 and 9 are designated by numbers increased by 100 and are not described in detail.

In particular, the accelerometer 150 of FIG. 10 comprises a suspended mass 151 (wherein only half of the structure is shown; the entire structure of the suspended mass 151 may be obtained by turning over the structure shown in FIG. 10 about the horizontal axis B).

The suspended mass 151 has a first half-mass 154 and a second half-mass 155, carried by a plurality of pillars 153 (in the shown embodiment, four pillars 153, two whereof are visible). In FIG. 10, a spring 170 connects the pillars 153 to the two half-masses 154, 155 (a similar spring, not shown, is obviously provided in the mobile half-mass 151, not shown). In the embodiment shown, the spring 170 has a broken-line structure, with a pair of first portions 170A (which extend from and about the respective pillars 153), a single central portion 170B (which is a prolongation of the first portions and extends along the rotation axis A), and two divergent portions 170C (which extend from the central portion 170B towards a respective half-mass 154, 155, perpendicularly to the rotation axis A). However, the shape of the spring 170 may vary and is not part of the present patent application.

According to the above, each half-mass 154, 155 has a plurality of openings, not symmetrical to the rotation axis A, the number and sizes whereof satisfy the relation of Eq. (3) or Eq. (3.1) referred to above.

In the embodiment shown, the half-mass 154, which has a smaller area, has dampening openings 175 accommodating a plurality of dampening structures 176 (two whereof are shown in FIG. 10), which are not part of the present patent application.

Moreover, in the embodiment shown, the first half-mass 154 has a delimitation side 177, generally parallel to the rotation axis A, having a projection 178 accommodating rectangular openings 179.

Further openings 180 may extend in the first half-mass 154, asymmetrical with respect to the second half-mass 155.

In the accelerometer 150, the dampening openings 175, the rectangular openings 179, and the further openings 180, all through openings, are studied so that the sum of their perimeters, together with the perimeters of the first holes 160, of the first half-mass 154, and of the half-trench of the spring 170, satisfies the relation, given by Eq. (3), with respect to the sum of the perimeters of the second holes 161, of the second half-mass 155, and of the other half-trench of the spring 170.

Thereby, by a simple sizing in the design stage, it is possible to drastically reduce or even cancel altogether the offset of the output signal due to the radiometric effect, in absence of other stresses.

Figure 11A:
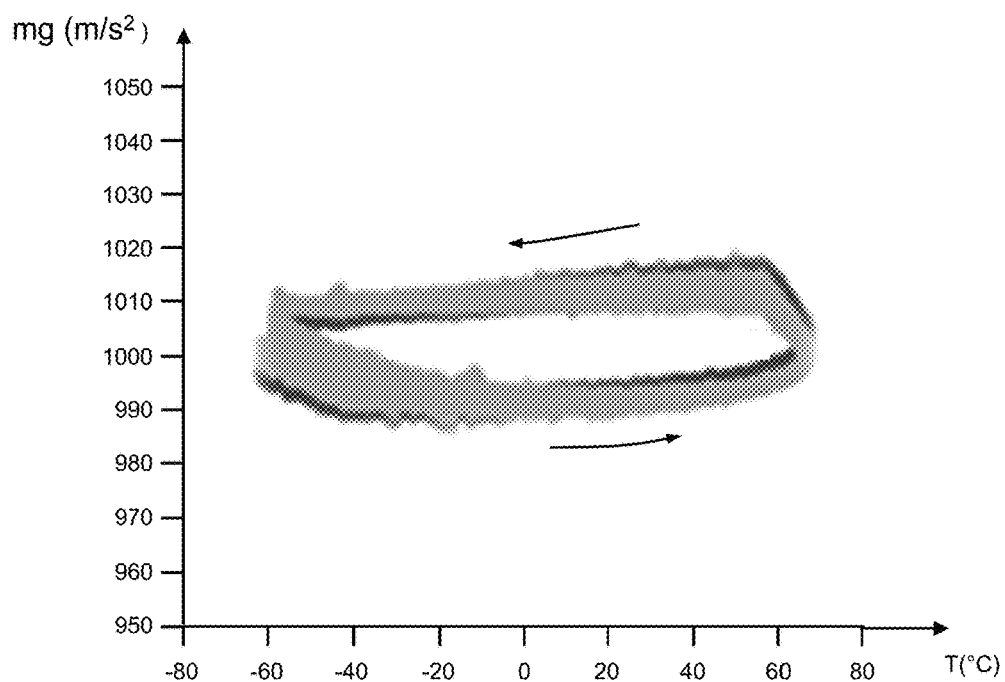
FIGS. 11A and 11B show the results of measurements made on a known device and on the device of FIG. 10.
Figure 11B:
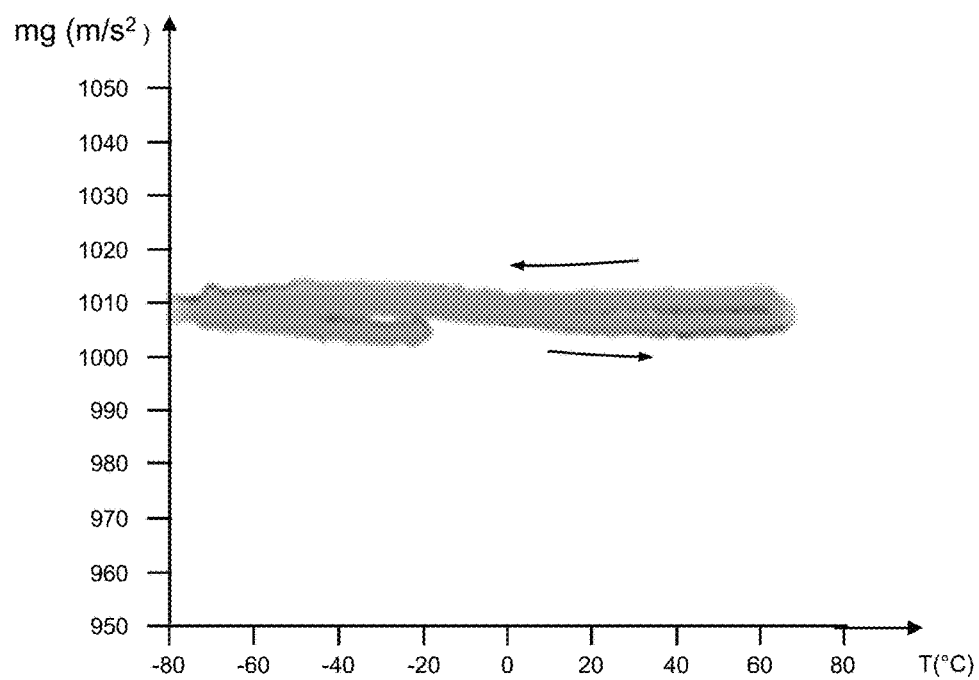

Studies conducted by the applicant have confirmed the theoretical results, as shown in FIGS. 11A and 11B, which represent hysteresis measurements performed on devices with similar structures, initially re-heated on one side from −80° C. up to approximately 60° C. and then cooled from approximately 60° C. down to −80° C. In particular, FIG. 11A shows the acceleration (in mg, where g is the acceleration of gravity) obtained with a traditional accelerometer having through openings linked only to usual geometrical and functional considerations and not satisfying relation (3) set forth above, and FIG. 11B shows the results obtained with the device of FIG. 10 and differing from the traditional accelerometer only as regards the geometry of the through openings. As may be noted, in the traditional device (FIG. 11A), the heating and cooling curves show high hysteresis, whereas in the device satisfying condition (3) (FIG. 11B), the heating and cooling curves are practically superimposed and there is practically no hysteresis.

The above result may be obtained by varying just the geometry and the perimeter of the openings, holes, and through trenches in the first half-mass 54 (i.e., the smaller size half-mass of FIG. 8); however, the modification of the through openings for satisfying relation (3) may also regard just the second half-mass 55 (of larger sizes). Advantageously, this condition maybe obtained without impact on the electromechanical parameters, the dimensions, and the mechanical strength of the mobile mass, and thus without impact on other performance parameters of the inertial sensor, while improving the behaviour in regard to radiometric forces.

Moreover, the sought sizing may be obtained without modification of the manufacturing process of the inertial sensor, and thus at unvaried manufacturing costs.

Figure 12:
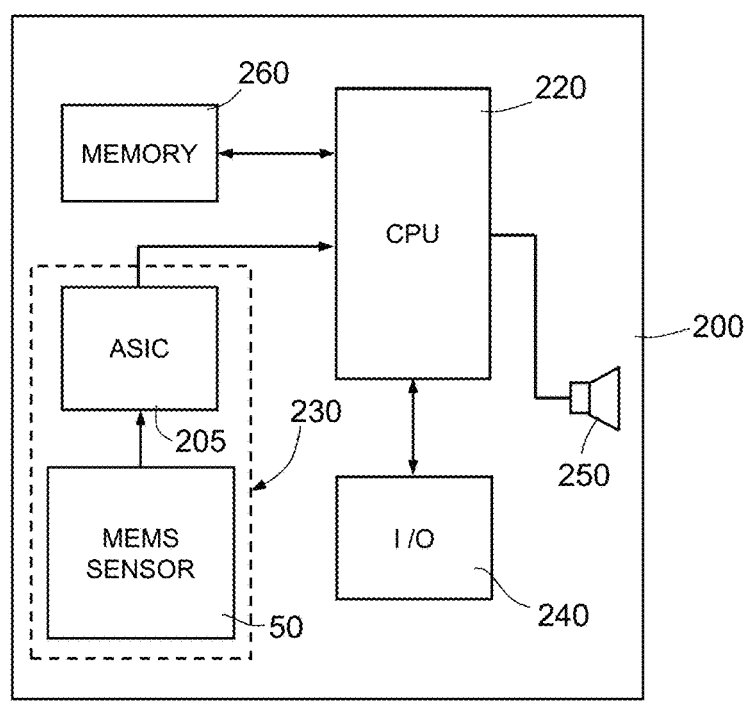
FIG. 12 shows a general block diagram of an electronic device incorporating the present device.

The described inertial sensor is particularly adapted to integration in an electronic device 200, as shown in FIG. 12, which may be used in a plurality of electronic systems intended for processing, storing, transmitting, and receiving signals and information. For instance, the electronic device 200 may be, for example, an inertial navigation system, an automotive system, or a portable system, such as a PDA (Personal Digital Assistant), a portable computer, a mobile phone, a wearable device, such as a smartwatch, a digital audio player, a photographic camera or a video camera.

The electronic device 200 may, for example, comprise the sensor 50, here forming an accelerometer; an electronic circuit 205, typically an ASIC, operatively coupled to the sensor 50, forming a reading interface for the sensor 50, supplying biasing signals to the sensor 50 (in a per se known manner, here not shown in detail), detecting the displacement degree of the mobile mass 51 (FIG. 8), and thus determining acceleration along Z acting on the mobile mass 51; and an electronic control unit 220, for example a microprocessor, connected to the electronic circuit 205 and configured to supervise general operation of the electronic device 200, for example on the basis of the detected accelerations. Moreover, the electronic apparatus 200 may comprise an input/output interface 240, for example having a keyboard and a display, connected to the electronic control unit 220, a speaker 250, for generating sounds on an audio output (not shown), and an internal memory 260. The sensor 50 and the electronic circuit 205 may be packaged in a packaging structure and form an inertial device 230.

Finally, it is clear that modifications and variations may be made to the MEMS device described and shown herein, without thereby departing from the scope of the present disclosure. In particular, as has been mentioned, the arrangement and number of through openings may vary widely with respect to what has been shown and also the shape and arrangement of the mobile mass and of the structures envisaged may be any, linked to the respective functions, with the condition that the openings satisfy the relation (3) above.

Furthermore, the various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MEMS device, comprising:
a mobile mass having an area in a plane and a uniform thickness in a direction perpendicular to the plane, the mobile mass being tiltable about a rotation axis extending parallel to the plane and thereby forming a first mass portion and a second mass portion arranged on opposite sides of the rotation axis, the first mass portion having a first outer perimeter and a first centroid, the second mass portion having a second outer perimeter and a second centroid, the first and second centroids being arranged at first and second distances b1, b2, respectively, from the rotation axis, wherein the first distance b1 is different from the second distance b2, wherein the first outer perimeter is different from the second outer perimeter;
a first quantity of a plurality of first through openings in the first mass portion, the plurality of first through openings being of a first size, wherein the first quantity and a sum of all perimeters of the first size of the plurality of first through openings and the first outer perimeter define a first total perimeter p1 in the plane; and
a second quantity of a plurality of second through openings in the second mass portion, the plurality of second through openings being of a second size that is less than the first size, wherein the second quantity and a sum of all perimeters of the second size of the plurality of second through openings and the second outer perimeter define a second total perimeter p2 in the plane, the second total perimeter p2 being different from the first total perimeter p1,
wherein the MEMS device is designed such that the first and the second total perimeters p1, p2 satisfy equation: $p1 \times b1 = p2 \times b2$ such that offsets caused by radiometric effects are reduced.

2. The MEMS device according to claim 1, wherein the MEMS device is at least one of an accelerometer or a gyroscope.

3. The MEMS device according to claim 1, wherein the mobile mass forms part of a Z-axis accelerometer.

4. The MEMS device according to claim 1, wherein the mobile mass is made from a monolithic semiconductor body.

5. The MEMS device according to claim 1, wherein a shape of the plurality of second through openings is different from a shape of the plurality of first through openings.

6. An electronic apparatus, comprising:
a MEMS device including:
a mobile mass having an area in a plane and a uniform thickness in a direction perpendicular to the plane, the mobile mass being tiltable about a rotation axis extending parallel to the plane and thereby forming a first mass portion and a second mass portion arranged on opposite sides of the rotation axis, the first mass portion having a first outer perimeter and a first centroid, the second mass portion having a second outer perimeter and a second centroid, the first and second centroids being arranged at a first distance b1 and a second distance b2, respectively, from the rotation axis, the first distance b1 being different from the second distance b2, wherein the first outer perimeter is different from the second outer perimeter;
a first quantity of a plurality of first through openings in the first mass portion, the plurality of the first through openings being of a first size, wherein the first quantity and a sum of all perimeters of the first size of the plurality of first through openings and the first outer perimeter define a first total perimeter p1 in the plane; and
a second quantity of a plurality of second through openings in the second mass portion, the plurality of the second through openings being of second size, wherein the second quantity and a sum of all perimeters of the second size of the plurality second through openings and the second outer perimeter define a second total perimeter p2 in the plane, the second total perimeter p2 being different from the first total perimeter p1,
wherein the MEMS device is designed such that the first and the second total perimeters p1, p2 satisfy equation: $p1 \times b1 = p2 \times b2$ such that offsets caused by radiometric effects are reduced;
an application specific integrated circuit coupled to the MEMS device;
a processing unit, coupled to the application specific integrated circuit;
an interface coupled to the processing unit; and
a storage device coupled to the processing unit.

7. The electronic device according to claim 6, wherein the electronic device is at least one of: an inertial navigation system, an automotive system, a personal digital assistant, a laptop, a mobile phone, a wearable device, a smartwatch, a digital audio player, a photographic camera or a video camera.

8. The electronic device according to claim 6, wherein the mobile mass is made from a monolithic semiconductor body.

9. The electronic device according to claim 6, wherein the mobile mass forms part of a Z-axis accelerometer or gyroscope.

10. The electronic device according to claim 6, wherein a shape of the plurality of second through openings is different from a shape of the plurality of first through openings.

11. A MEMS device, comprising:
a substrate;
a first electrode and a second electrode coupled to the substrate;
a pillar having a first end and a second end, wherein the first end is coupled to the substrate between the first and second electrodes; and a mobile mass tiltably coupled to a second end of the pillar, the mobile mass comprising:
  an area in a plane and a unique thickness in a direction perpendicular to the plane, the mobile mass being tiltable about a rotation axis extending parallel to the plane and thereby forming a first mass portion and a second mass portion arranged on opposite sides of the rotation axis, the first mass portion having a first outer perimeter and a first centroid, the second mass portion having a second outer perimeter and a second centroid, the first and second centroids being arranged at a first distance b1 and a second distance b2, respectively, from the rotation axis, wherein the first distance b1 is different from the second distance b2, wherein the first outer perimeter is different from the second outer perimeter;
  a first quantity a plurality of first through openings in the first mass portion, the plurality of first through openings being of a first size, wherein the first quantity and a sum of all perimeters of the first size of the plurality of first through openings and the first outer perimeter define a first total perimeter p1 in the plane; and
  a second quantity of a plurality of second through openings in the second mass portion, the plurality of second through openings being of a second size that is less than the first size, wherein the second quantity and a sum of all perimeters of the second size of the plurality of second through openings and the second outer perimeter define a second total perimeter p2 in the plane,
  wherein the second total perimeter p2 is different from the first total perimeter p1,
  wherein the MEMS device is designed such that the first distance b1, the second distance b2, the first total perimeter p1, and the second total perimeter p2 satisfy equation: $p1 \times b1 = p2 \times b2$ such that offsets caused by radiometric effects are reduced.

12. The MEMS device according to claim 11, wherein a shape of the first mass portion is different from a shape of the second mass portion.

13. The MEMS device according to claim 11, wherein the pillar is located offset from a central axis of the mobile mass.

14. The MEMS device according to claim 11, wherein the mobile mass is made from a monolithic semiconductor body.

15. The MEMS device according to claim 14, wherein the monolithic semiconductor body is silicon.

16. The MEMS device according to claim 11, wherein the mobile mass forms part of a Z-axis accelerometer.

\* \* \* \* \*